United States Patent [19]

Qualich

[11] Patent Number: 4,774,624
[45] Date of Patent: Sep. 27, 1988

[54] BOOST VOLTAGE POWER SUPPLY FOR VEHICLE CONTROL SYSTEM

[75] Inventor: John R. Qualich, Buffalo Grove, Ill.

[73] Assignee: Motorola, Inc., Schaumburg, Ill.

[21] Appl. No.: 70,019

[22] Filed: Jul. 6, 1987

[51] Int. Cl.⁴ .............................................. H01H 47/00
[52] U.S. Cl. ...................................... 361/159; 123/490
[58] Field of Search ................ 361/159, 168.1, 169.1; 123/490; 315/290, 356

[56] References Cited

U.S. PATENT DOCUMENTS

| | | | |
|---|---|---|---|
| 3,456,628 | 7/1969 | Bassot et al. | 123/490 |
| 3,549,955 | 12/1970 | Paine | 361/155 |
| 3,660,730 | 5/1972 | Mason | 361/152 |
| 3,665,901 | 5/1972 | Monpetit et al. | 123/490 |
| 4,327,693 | 5/1982 | Busser | 123/490 |

*Primary Examiner*—L. T. Hix
*Assistant Examiner*—David M. Gray
*Attorney, Agent, or Firm*—Donald B. Southard; Phillip H. Melamed; John H. Moore

[57] ABSTRACT

Inductor coil (13) of a relay (12) used to supply battery power to a power load (11) of a vehicle engine control system (10) is also used to provide a substantially higher than battery voltage ($V_{Batt}$) boost voltage ($V_{Boost}$) for vehicle control apparatus (20). Microprocessor (21) generates a control signal ($V_{in}$) having a 10:1 duty cycle for control of current excitation of the coil (13) during an effective on logic state for the relay (12). During coil current interruptions during the on logic state, energy stored in the inductor (13) is utilized via a rectifier means (26 and 27) to provide the boost voltage. During the on relay state, a movable member (14) of the relay is maintained in its actuated position since current interruptions during the on state are shorter than the relaxation time required for the movable member to assume a nonactuated state. The relay coil generates boost voltage without requiring an additional substantial inductive reactance, and without waiting until the end of the effective on logic state.

17 Claims, 2 Drawing Sheets

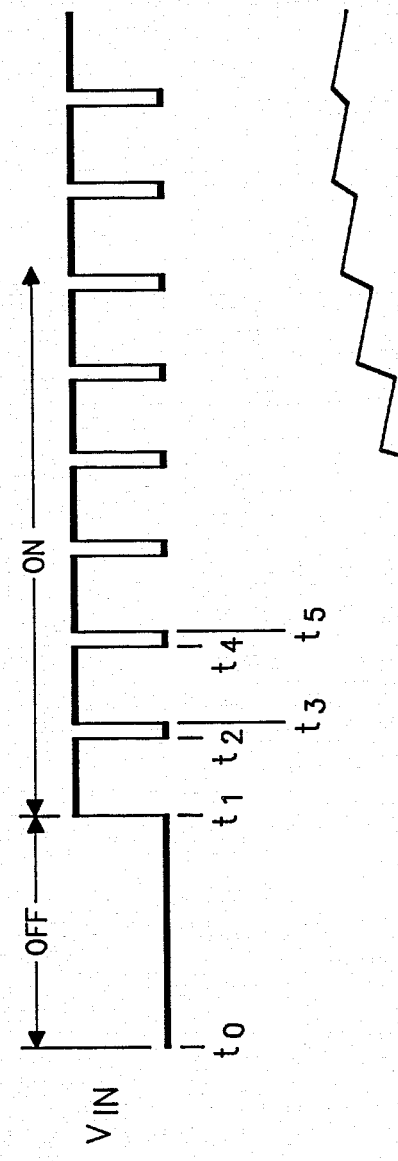

BOOST VOLTAGE POWER SUPPLY FOR VEHICLE CONTROL SYSTEM

BACKGROUND OF THE INVENTION

In electronic vehicle control systems, it is occasionally necessary to develop a boost voltage potential which is greater than the vehicle battery voltage. This boost voltage is typically utilized in providing an initial high pull-in current for engine fuel injectors. Boost voltage can also be utilized to supply a required higher than battery voltage drive signal for FET transistors which have their drain electrode connected to battery voltage such that the gate drive voltage must be higher than battery voltage to insure turning on the FET. The present invention is related to a boost voltage power supply which efficiently and economically develops a higher than battery voltage boost voltage potential, and the use of such a boost voltage power supply in a vehicle control system.

Typically, the larger than battery voltage boost voltage is developed by circuits which utilize an additional capacitive or inductive reactance to store energy and then utilize rectification circuits to retrieve this stored energy at appropriate times so as to develop a higher than battery voltage boost voltage potential. In such circuits, it is typically necessary to provide an additional relatively large and expensive capacitive or inductive reactance to store the energy to be utilized for developing the boost voltage. This is in addition to any storage capacitance which may be utilized to maintain the developed boost voltage potential. Thus, typically solenoid drivers for fuel injection systems utilize a separate additional coil for energy storage so as to develop a boost voltage potential which is applied to fuel injectors to enhance the response time of these injectors during an initial pull-in period.

In some prior systems, the inductance of the fuel injector solenoid is used to develop boost voltage. However, in these prior systems, developing boost voltage only occurs at the end of an effective on logic state of the solenoid, and this limits the availability and magnitude of the developed boost voltage since boost voltage is only replenished at the end of each effective on state of the solenoid.

SUMMARY OF THE INVENTION

An object of the present invention is to provide an improved boost voltage power supply adaptable for use in a vehicle control system which overcomes the above-mentioned deficiencies of prior systems.

More specifically, an object of the present invention is to provide an improved boost voltage power supply which does not require an additional inductive reactance used for providing the boost voltage, but makes use of an existing inductive reactance which is being used for a vehicle control system function.

In one embodiment of the present invention, a boost voltage power supply is provided. The power supply comprises: terminal means at which a nominal voltage potential with respect to a reference potential is provided; an electromagnetic device comprising an inductor coil having a first end terminal connected to said terminal means and a second end terminal, effective current excitation above a first level through said coil resulting in positioning and maintaining a movable member of said electromagnetic device in an actuated position and effective current excitation below a second level resulting in positioning and maintaining said movable member in a nonactuated position; electrically controllable switch means having at least two series terminals selectively providing effective short or open circuits therebetween in accordance with the magnitude of a control signal at a control terminal of said switch means, one of said series terminals coupled to said coil second end terminal and another of said series terminals coupled to said reference potential; control means coupled to said control terminal for providing said control signal thereat, said control signal having effective on and off logic states corresponding to said actuated and nonactuated positions of said movable member, respectively, said control signal having a duty cycle rate between 0 and 100% during at least one of said on and off logic states and providing resultant current through said coil, via said switch means alternately providing said short and open circuits at said duty cycle rate, while causing said electromagnetic device to position and maintain the movable member in a corresponding one of said actuated and nonactuated positions during said at least one of said logic states; and rectifier means coupled to said inductor coil for, in response to said alternate providing of short and open circuits between said series terminals during said at least one of said logic states, rectifying a signal produced by said coil and providing a boost voltage potential with respect to said reference potential at an output terminal, said boost voltage potential being substantially greater than said nominal voltage potential.

Essentially, the above-stated feature involves the use of an electromagnetic device having a movable member. This electromagnetic device can comprise, for example, either a fuel injector solenoid or a relay. In either case, a control signal is generated which will implement either actuation or nonactuation of the solenoid or relay. However, according to the teachings of the present invention, the inductor current duty cycle during actuation (and/or nonactuation) is between zero and 100% such that while the solenoid is maintained in its actuated or nonactuated state, the inductor will be effectively periodically current pulsed. This pulse excitation of the inductor, during an on or off state of the solenoid or relay, enables retrieving the energy stored in the inductor by means of a rectification circuit, and this enables the development of a boost voltage which can be several times the nominal voltage potential. Typically, the nominal voltage potential corresponds to vehicle battery voltage potential and the reference potential corresponds to ground potential.

Through use of the present invention, a boost voltage of approximately 100 volts can be achieved with a 12 volt battery potential. This is accomplished without the use of an additional and expensive inductive reactance. Preferably the utilized electromagnetic device, having the inductor, corresponds to an existing relay utilized to provide the power connection between the battery and a power load, such as an electronic vehicle clutch control apparatus. The boost voltage which is developed can be utilized as the gate drive signal for an FET device having its drain electrode connected to battery voltage. This configuration is desirable since it permits the use of the FET for providing a direct connection, when on, between battery voltage and an electronic vehicle control apparatus such as a motor which implements either clutch control operations or other vehicle control operations.

In essence, the preferred embodiment of the present invention illustrates the use of a solenoid relay coil not only for providing its intended function of providing a power contact between battery voltage and a power load, but also for developing a boost voltage which is substantially greater than battery voltage and is used by vehicle control apparatus. Typically, a microprocessor will generate a 10 to 1 duty cycle excitation signal $V_{in}$ such that the relay can be maintained in an effective on condition even though current through the relay inductor (solenoid) is pulsed on and off. During the short duration current interruptions of this pulsing, the energy stored in the solenoid is retrieved by a diode and capacitor rectification circuit so as to develop the boost voltage. The current interruption time for the relay during this pulsed excitation is designed to be short enough such that the inertia of the movable member of the solenoid will prevent the movable member from returning to its nonactuated state.

While the present invention is primarily described in terms of providing pulsed excitation for the relay solenoid during its effective on time, obviously a similar result can be achieved by providing pulsed excitation for the relay during its off time wherein now the pulsed current excitation would be of such short duration that the movable member of the relay would remain in its nonactuated state. In either event, boost voltage has now been achieved without the use of an additional and expensive inductive reactance since the present invention uses the solenoid inductance of an existing relay provided in a vehicle control system. While some references have suggested utilization of the energy stored in a fuel injector coil at the end of the on cycle of the fuel injector, these systems are somewhat limited in their applicability because energy is only recoverable at the end of the effective on cycles used for the fuel injectors. Also, such systems typically use an extra inductance, in addition to the fuel injector inductances, to develop boost voltage. The present invention represents a radical departure since it suggests dual utilization of an existing inductance during its effective on or off state to develop boost voltage. This results in a much simpler circuit design while readily enabling the development of a substantially larger boost voltage since the accessing of stored energy is not restricted to just the end of an effective on or off logic state of a solenoid or relay.

BRIEF DESCRIPTION OF THE DRAWINGS

For a more complete understanding of the present invention, reference should be made to the drawings in which:

FIG. 2 comprises a series of graphs 2A and 2B illustrating voltage waveforms for signals produced by the circuitry shown in FIG. 1.

DETAILED DESCRIPTION OF THE PREFERRED EMBODIMENTS OF THE INVENTION

Figure 1:
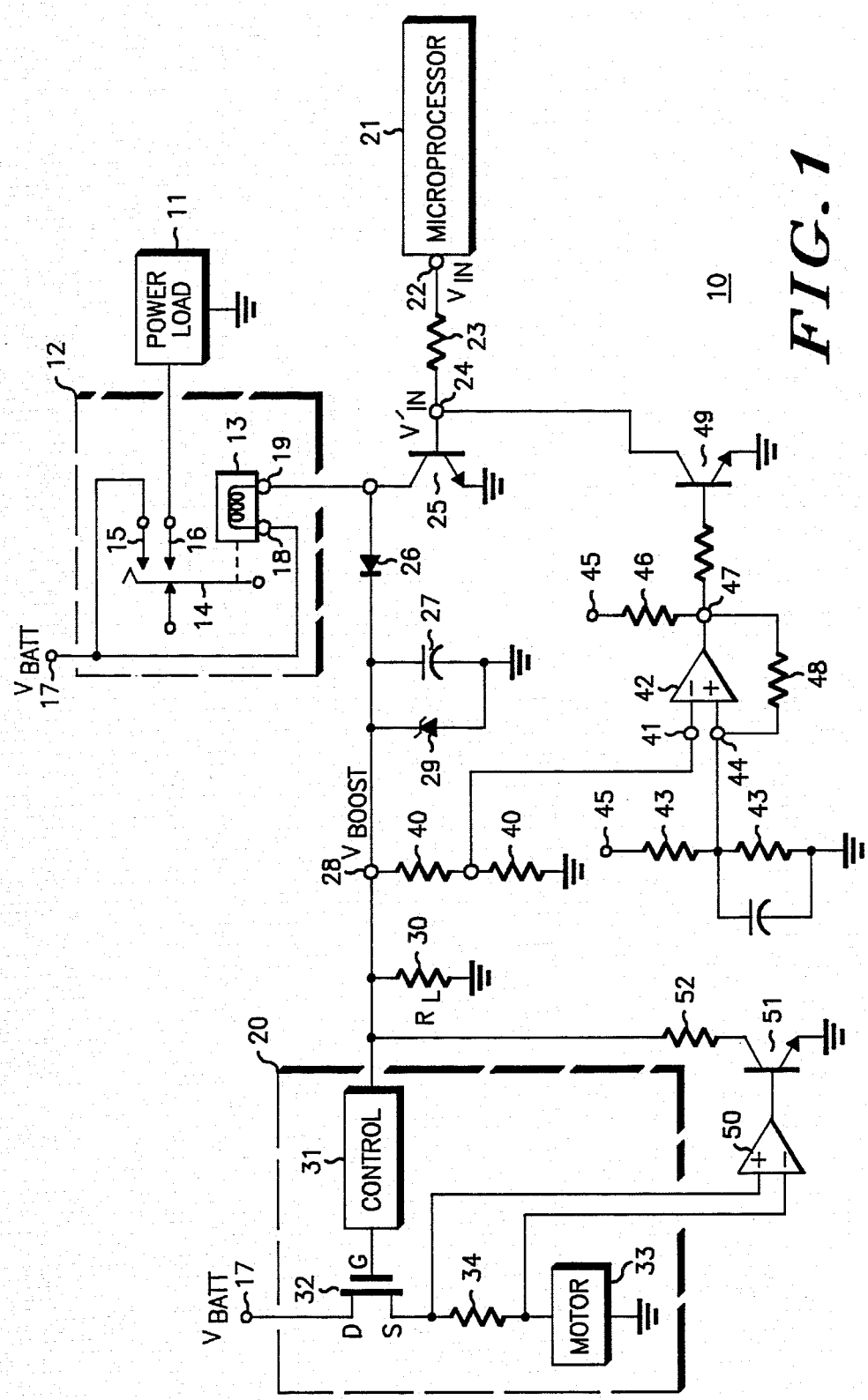
FIG. 1 is a schematic diagram of a vehicle electronic control system utilizing a boost voltage power supply constructed in accordance with the present invention.

Referring to FIG. 1, a vehicle electronic control system 10 is illustrated which includes a boost voltage power supply. The system 10 includes a vehicle electronic clutch control apparatus which corresponds to a power load circuit 11 shown in FIG. 1. Operative power to the power load 11 is provided by a relay 12 (shown dashed) which comprises an electromagnetic device including an inductor solenoid coil 13, a movable member 14 whose position is determined by the DC current excitation of the coil 13, and a pair of contacts 15 and 16. Contact 16 is connected to the power load 11 and contact 15 is connected to a battery voltage terminal 17 at which a nominal vehicle battery voltage potential ($V_{Batt}$), such as positive 12 volts, is provided with respect to ground potential.

Essentially, the operation of the relay 12 is as follows. When effective (average) current through the solenoid 13 is above a first predetermined reference level, the resulting magnetic field positions and maintains the movable member 14 in an actuated position such that a direct short circuit is provided between the contacts 15 and 16 thereby providing operative battery voltage power to the power load 11. When effective current through the solenoid coil 13 is below a second predetermined level, the movable member 14 is positioned such that an open circuit is provided between the contacts 15 and 16 thereby removing operative power from the power load 11. Thus the above-noted operation of the relay 12 is essentially conventional. The present invention involves utilization of this conventional relay to also develop a boost voltage potential with respect to ground substantially in excess of the 12 volt battery voltage without interfering with the above-stated operation of the relay. This is accomplished in the following manner.

The inductor coil 13 has a first end terminal 18 directly connected to the battery voltage terminal 17 and a second end terminal 19. Typically, either an open circuit or a direct connection to ground is provided at the terminal 19. These conditions, if maintained for a time interval, result in positioning the movable member 14 into either its nonactuated or actuated position by providing either zero DC current or a maximum DC current through the inductor coil 13 throughout effective off or on operative logic states of the relay 13, respectively. The relay off state corresponds to an open circuit between contacts 15 and 16, and the relay on state corresponds to a short circuit between the contacts due to the position of member 14.

The present invention differs from the above-described conventional relay operation in that during effective on or off relay operation, it is contemplated that current excitation through the inductor coil 13 will essentially be implemented in accordance with the duty cycle rate of a control signal wherein this duty cycle rate, during either the on and/or off logic state of the relay, will be between 0 and 100%. This results in constantly pulsing the current excitation through the relay coil 13 while still maintaining the effective (average) current through this coil either above the first reference level current or below the second reference level current so as to position and maintain the movable member 14 in its actuated or nonactuated state. This is possible because of the inertia of the movable member 14. Thus, for example, when turning the relay 12 on, it is contemplated that a relatively high duty cycle of current excitation will be provided for the inductor coil 13 such that a 90% duty cycle is implemented by providing a short circuit from terminal 19 to ground for 90% of a predetermined repetition rate. For 10% of the time, current to the inductor coil 13 will be interrupted resulting in a collapse of the magnetic field created by the inductor 13. However, during this short 10% duration, the inertia of the movable member 14 will retain this member in its actuated position until the next cyclic recommencement of current excitation for the inductor 13. Thus because the 10% off time for the relay 12 during its effective on state is less than the opening or relaxation time required for the movable member 14, the relay 12 will remain in an effective on condition even though pulse current excitation is applied to the inductor 13.

The reason for the present invention utilizing pulsed current excitation for coil 13 is that now it is possible to utilize the energy stored in the inductor coil 13 to provide a higher than battery voltage boost voltage. The energy stored in coil 13 now is accessible during each collapse of the magnetic field created by the coil 13. Thus generating the boost voltage will occur during, not just at the end of, the effective on logic state of the relay 12. All this is accomplished without interfering with the normal operation of the relay 12 since it is maintained in an effective on condition as long as the duty cycle rate and the coil current interruption time during the on logic state are properly selected. The boost voltage which is generated is then utilized by additional vehicle electronic control means, such as the apparatus 20 shown in FIG. 1. The apparatus 20 can comprise, for example, either vehicle fuel injection apparatus or vehicle electronic transmission control apparatus, such as the power load 11. The manner in which the present invention utilizes, during the relay on state, energy stored in the relay coil 13 to develop a boost voltage will now be described.

In FIG. 1, a microprocessor 21 is utilized as a control means to provide a control signal $V_{in}$ at a control terminal 22. This signal is coupled through a resistor 23 to a terminal 24 at which a slightly attenuated amplitude signal $V'_{in}$ is provided which varies in substantially the same manner as signal $V_{in}$.

FIG. 2A illustrates the signal $V_{in}$ with the vertical axis being magnitude and the horizontal axis being time. At a time $t_0$, the microprocessor provides zero output to insure the off or unactuated logic state of the relay 12, and this is maintained until a time $t_1$ at which time the microprocessor 21 will implement a predetermined duty cycle rate comprising an on period of 1 millisecond and an off period of 100 microseconds. This is illustrated in FIG. 2A by the signal $V_{in}$ rising to a high level at a time $t_1$, falling to a zero level at a subsequent time $t_2$ and again rising to a high level at a subsequent time $t_3$. At the time $t_3$ repetition of the duty cycle rate, which is approximately 10 to 1, will recommence. The time period from $t_0$ to $t_1$ represents an effective off or unactuated logic state for the relay 12 since the average current in coil 13 during this time period is zero. The time subsequent to the time $t_1$ represents an effective on logic state for the relay 12, after a short initial closing time period, since a high average current in coil 13 now exists which is sufficient to move the member 14 into its actuated position.

The terminal 24 corresponds to the base electrode of an NPN transistor 25 having its emitter electrode connected to ground potential (which corresponds to a predetermined reference potential) and its collector electrode directly connected to the second end terminal 19 of the inductor coil 13. This configuration results in the transistor 25 corresponding to an electrically controllable switch means having at least two series terminals, the collector and emitter electrodes of transistor 25, selectively providing effective short or open circuits therebetween in accordance with the magnitude of the signal $V'_{in}$ at the terminal 24. In response to the control signal $V_{in}$, the transistor 25 will alternately provide short and open circuits during the on logic state for the relay 12. During the interruption of current through the inductor coil 13 during the on logic state, which occurs at times such as the time $t_2$ through $t_3$, the magnetic field of the inductor 13 will collapse resulting in the development of a high voltage at the terminal 19. The boost voltage circuit of the present invention effectively recovers the energy stored in the coil 13 that creates this high voltage at the terminal 19. This energy recovery is accomplished by a rectifying circuit comprising a diode 26 and a capacitor 27 connected as shown in FIG. 1. The diode 26 peak-rectifies the signal at the terminal 19 due to the collapse of the coil 13 magnetic field and stores this peak-rectified signal on one plate of the capacitor 27 which plate is connected to an output terminal 28 at which the boost voltage $V_{Boost}$ is provided. Another plate of the capacitor 27 is connected to ground.

A Zener diode 29 is connected between the terminal 28 and ground potential and is utilized to provide an absolute maximum limit for the magnitude of the boost voltage provided at the terminal 28. In addition, an effective resistive load $R_L$ is provided between the terminal 28 and ground and is illustrated by the resistor 30 in FIG. 1. This resistor can comprise an actual load which requires the boost voltage at the terminal 28, or it can comprise predetermined resistors inserted in the circuit to insure proper circuit operation by providing a resistive path between the terminal 28 and ground potential. In addition to the resistive load 30, the boost voltage terminal 28 is also connected to the electronic vehicle control apparatus 20 which, as stated before, can comprise either fuel injection apparatus or other engine control apparatus such as the electronic transmission control apparatus 11. The apparatus 20 comprises a control circuit 31 which is intended to either selectively connect or disconnect a gate electrode of an FET transistor 32 to the terminal 28 in accordance with desired apparatus operation. A drain electrode of the FET transistor is directly connected to the battery voltage terminal 17 and a source electrode of the FET is connected to ground through an appropriate load such as a motor 33 and a small magnitude motor current sense resistor 34 shown in FIG. 1. The motor 33 can be a transmission control motor used to selectively position a vehicle transmission clutch.

Essentially, the apparatus 20 uses an FET transistor, such as the transistor 32, to act as a high power battery switch for the motor 33 so that substantially all of the battery voltage is directly applied across the motor. This is desirable and is most advantageously implemented when the drain electrode of the power FET is directly connected to battery voltage so that substantially all of the battery voltage is directly applied across the motor when the FET is on. However, in order to turn the FET on and maintain it in an on condition, a gate to source potential of at least 10 volts is required. Since the source voltage when the FET is on will be approximately the same as the drain voltage, this requires providing a higher than battery voltage signal at the gate electrode of the FET. Thus the boost voltage power supply of the present invention solves this problem by developing a boost voltage at the terminal 28 which is substantially higher than battery voltage. Then the control circuit 31 selectively couples the high boost voltage to the gate electrode to insure the desired turning on of the FET transistor 32. This then provides battery power to the motor 33 since when the transistor 32 is on, the drain and source voltages will both be at approximately battery voltage.

The manner in which the present invention creates the substantially greater boost voltage at the terminal 28 can be understood by referring to FIG. 2B which is a graph illustrating boost voltage as a function of time wherein the developed boost voltage is produced in response to the signal $V_{in}$ shown in FIG. 2A. Prior to the commencement of the on logic state which starts at the time $t_1$, boost voltage is maintained at a voltage approximately 1 diode drop below battery voltage. This represents the voltage at the terminal 17 minus the diode drop of the diode 26 and corresponds to the voltage across the capacitor 27. This ignores any minor voltage drop across coil 13. During the time $t_1$ through $t_2$, the voltage at the terminal 19 will essentially be held at ground potential due to the turning on and saturation of the transistor 25 by the signal $V_{in}$. This does not substantially affect the voltage across the capacitor 27 because the diode 26 will now be reverse biased preventing any substantial discharging of the capacitor 27 through transistor 25. However, the boost voltage will decrease slightly due to the discharge of capacitor 27 through resistor 30 and a resistor divider 40. During the time $t_1$ to $t_2$, current will build up in the inductor 13, and the movable member 14 will be moved to its actuated position shorting out the terminals 15 and 16 and providing power to the power load 11. At the time $t_2$, current through the inductor 13 will start to decay, and this will result in the collapse of the magnetic field for the short duration time between the times $t_2$ and $t_3$. The collapsing magnetic field results in a large positive voltage being produced at the terminal 19. This will result in charging the capacitor 27 so as to store therein the energy which was previously stored in the coil 13 and has now resulted in the creation of the large positive voltage at the terminal 19. Essentially, this results in a positive step for the boost voltage developed at the terminal 28.

During the time $t_3$ to $t_4$, the transistor 25 will again be turned on, but again the diode 26 will prevent any substantial discharging of the now higher voltage being maintained at the terminal 28 through transistor 25. However, this higher voltage will decrease somewhat due to the discharging of the capacitor 2 through the resistive load 30 and the divider 40, and this is responsible for the decrease in boost voltage between the times $t_3$ and $t_4$. During the next current interruption which occurs between the times $t_4$ and $t_5$, another step increase will occur for the boost voltage at the terminal 28, and the entire process will again recommence at $t_5$ with the turning on of the current through the inductor coil 13. This continues as shown in FIG. 2B with the step increases becoming gradually smaller and the voltage decrease of boost voltage during the on time of the transistor 25 being somewhat larger since now a higher voltage is at the terminal 28 resulting in more current through the resistive load 30 and divider 40. This continues until an equilibrium condition is reached or until the Zener diode 29 is broken down. The Zener diode 29 provides an absolute limit on the maximum boost voltage maintainable at the terminal 28.

It should be noted that it is contemplated that the control apparatus 20 will not create a significant current drain for the voltage across the capacitor 27 since the control circuit 31 will merely couple the boost voltage to the gate electrode of the FET wherein only small gate currents are contemplated. Thus, even with the control circuit 31 implementing a direct connection of the gate electrode of the FET 32 to the terminal 28, circuit operations will result in waveforms very similar to those shown in FIGS. 2A and 2B.

The preceding description of the present invention illustrates how, during normal on logic state operation of the relay 12, the inductor coil 13 of this relay is used in a dual function manner to implement a boost voltage. The developed boost voltage can reach 90 to 100 volts with respect to ground potential, as opposed to the battery voltage of 12 volts with respect to ground. All that is required is to implement a pulsing current excitation for the relay inductor instead of a constant DC current excitation, when the relay is intended to implement a constant on logic state. A similar dual mode of operation could also be implemented if the relay was intended to normally function in an unactuated or off state. This could be implemented by having the microprocessor 21 generate a $V_{in}$ signal having a very short duty cycle rate during the off logic state of the relay. However, such a configuration would pose some potential design problems since during the short pulsing of current through the inductor 13 during the relay off logic state, only a limited amount of energy could be stored in the inductor 13. Thus only a limited amount of energy would be available for developing a boost voltage by the rectifying and capacitive storage elements 26 and 27.

The remaining circuitry shown in FIG. 1 essentially comprises a protection circuit which will sense when an unintended short circuit may be present between the FET source electrode and ground potential due to malfunctioning of the motor 33. In the event of such a condition, it will be undesirable to continue pulse current excitation for the relay coil 13 since now this will just result in excessive battery current being passed through the short circuit. Thus to prevent this condition, a sensing circuit is provided which will result in insuring that the transistor 25 is turned off. This is accomplished in the following manner.

The resistor divider 40 essentially senses the voltage at the terminal 28 and provides a related signal at an input terminal 41 connected to the negative input of a voltage comparator 42. Another voltage divider 43 provides a reference voltage at a terminal 44 corresponding to the positive input terminal of the comparator 42 wherein the voltage divider 43 works off of a reference voltage provided at a terminal 45. The terminal 45 is also coupled through a resistor 46 to an output terminal 47 of the comparator 42, and a resistor 48 is utilized to provide hysteresis by implementing a feedback path between the terminals 44 and 47. The end result is a threshold comparison circuit with hysteresis that results in providing a positive signal at the terminal 47 if the boost voltage at the terminal 28 falls below a predetermined minimum threshold level. It is contemplated that this minimum threshold level will correspond to a circuit malfunction such as the existence of a short circuit between the FET source electrode and ground potential.

A DC comparator 50 having a predetermined threshold switching level has its positive and negative inputs connected across resistor 34 and its output connected to the base electrode of an NPN transistor 51. The emitter electrode of transistor 51 is connected to ground, and the collector electrode is connected to terminal 28 through a resistor 52.

In the event of a short circuit at the FET source electrode to ground, a larger than normal voltage drop will exist across the motor current sense resistor 34. This will cause the output of comparator 50 to go high and turn on transistor 51. This results in reducing the boost voltage at terminal 28 below a predetermined minimum voltage due to resistor 52. In response to this very low boost voltage, a high voltage is provided at the terminal 47, and this results in turning on a subsequent NPN transistor 49 so as to saturate this transistor and maintain the input terminal 24 at substantially ground potential. This will prevent the turning on and off of the transistor 25 since the transistor 25 will now be maintained in an off condition. Transistor 25 will remain off since the resistor 48 will maintain the output of the comparator 42 high by raising the signal at the comparator positive input once the comparator provides a high output signal. Alternatively, other methods of effectively latching the output of the comparator 42 could be used, such as initially providing a low signal at terminal 44 prior to any initial build-up of boost voltage and subsequently having divider 43 provide a higher reference voltage at terminal 44. Regardless of the type of latching circuitry used, the end result is that pulsed current excitation of the inductor coil 13 of the relay 12 will cease during the existence of this short circuit resulting in preventing excessive currents from being drawn by the short circuit and also resulting in turning off the relay 12. This protection circuit implemented by the components 40 through 52 is optional and essentially monitors the boost voltage to shut off relay operation in the event of too low of a boost voltage which is indicative of a short circuit. It should be noted that the Zener diode 29 also represents a sort of protection circuit in that it puts a limit on the maximum boost voltage obtainable at the terminal 28.

While specific embodiments of the present invention have been shown and described, further modifications and improvements will occur to those skilled in the art. Such modifications could comprise, for example, utilizing other electromagnetic devices instead of the relay 12. For example, the inductor solenoid in a fuel injector could be utilized in accordance with the present invention as long as during either the effective actuated or nonactuated (on or off) state of the fuel injector pulsed solenoid current was provided. In such a situation, the collapse of the magnetic field of the injector solenoid during the effective on or off state would be utilized, via rectification circuitry, to produce a boost voltage. This is distinguished from the prior techniques of utilizing the energy stored in a solenoid injector only at the end of its effective on or off state. According to the present invention, boost voltage is developed during the effective on or off state through the rectification of the signals resulting from pulsed excitation of the inductor which occurs during the effective on or off state. Another possible variation of the present invention is to use an additional winding to magnetically couple the rectifier components 26 and 27 to the inductor coil 13, rather than connecting these components to terminal 19. All such modifications which retain the basic underlying principles disclosed and claimed herein are within the scope of this invention.

I claim:

1. A boost voltage power supply comprising:
    terminal means at which a nominal voltage potential with respect to a reference potential is provided;
    an electromagnetic device comprising an inductor coil having a first end terminal connected to said terminal means and a second end terminal, effective current excitation above a first level through said coil resulting in positioning and maintaining a movable member of said electromagnetic device in an actuated position and effective current excitation below a second level resulting in positioning and maintaining said movable member in a nonactuated position;
    electrically controllable switch means having at least two series terminals selectively providing effective short or open circuits therebetween in accordance with the magnitude of a control signal at a control terminal of said switch means, one of said series terminals coupled to said coil second end terminal and another of said series terminals coupled to said reference potential;
    control means coupled to said control terminal for providing said control signal thereat, said control signal having effective on and off logic states corresponding to said actuated and nonactuated positions of said movable member, respectively, said control signal having a duty cycle rate between 0 and 100% during at least one of said on and off logic states and providing resultant current through said coil, via said switch means alternately providing said short and open circuits at said duty cycle rate, while causing said electromagnetic device to position and maintain the movable member in a corresponding one of said actuated and nonactuated positions during said at least one of said logic states;
    rectifier means coupled to said inductor coil for, in response to said alternate providing of short and open circuits between said series terminals during said at least one of said logic states, rectifying a signal produced by said coil and providing a boost voltage potential with respect to said reference potential at an output terminal, said boost voltage potential being substantially greater than said nominal voltage potential.

2. A boost voltage power supply according to claim 1 wherein said reference potential corresponds to ground potential.

3. A boost voltage power supply according to claim 1 wherein said electromagnetic device comprises a relay and wherein said movable member results in shorting together two contacts of said relay during the effective on logic state of said control signal.

4. A boost voltage power supply according to claim 3 wherein said relay during said effective on logic state provides operative power to an electronic vehicle clutch control.

5. A boost voltage power supply according to claim 1 which includes protection means having an input coupled to said output terminal for sensing and controlling the magnitude of said boost voltage.

6. A boost voltage power supply according to claim 5 wherein said protection means has an output coupled to said control terminal and wherein in response to too low a voltage at said output terminal said protection means prevents said control means from providing current variation, at said duty cycle rate, through said coil during said at least one logic state.

7. A boost voltage power supply according to claim 1 wherein said switch means comprises a transistor.

8. A boost voltage power supply according to claim 7 wherein said transistor has a base electrode corresponding to said control electrode and has collector and emitter electrodes corresponding to said series terminals.

9. A boost voltage power supply according to claim 1 wherein said reference potential corresponds to ground potential, wherein said electromagnetic device comprises a relay and wherein said movable member results in shorting together two contacts of said relay during the on logic state of said control signal, wherein said switch means comprises a transistor and wherein said transistor has a base electrode corresponding to said control terminal and has collector and emitter electrodes corresponding to said series terminals.

10. A boost voltage power supply according to claim 1 wherein said duty cycle rate corresponds to approximately a 10 to 1 duty cycle for said control signal.

11. A boost voltage power supply according to claim 1 wherein said rectifier means includes a diode and a capacitor.

12. A boost voltage power supply according to claim 1 wherein said signal rectified by said rectifier means is produced by said coil at said coil second end terminal, and said rectifier means is connected thereto.

13. A vehicle electronic control system, including a boost voltage power supply, comprising:
   terminal means at which a nominal voltage potential with respect to a reference potential is provided;
   an electromagnetic device comprising an inductor coil having a first end terminal connected to said terminal means and a second end terminal, effective current excitation above a first level through said coil resulting in positioning and maintaining a movable member of said electromagnetic device in an actuated position and effective current excitation below a second level resulting in positioning and maintaining said movable member in a nonactuated position;
   electrically controllable switch means having at least two series terminals selectively providing effective short or open circuits therebetween in accordance with the magnitude of a control signal at a control terminal of said switch means, one of said series terminals coupled to said coil second end terminal and another of said series terminals coupled to said reference potential;
   control means coupled to said control terminal for providing said control signal thereat, said control signal having effective on and off logic states corresponding to said actuated and nonactuated positions of said movable member, respectively, said control signal having a duty cycle rate between 0 and 100% during at least one of said on and off logic states and providing resultant current through said coil, via said switch means alternately providing said short and open circuits at said duty cycle rate, while causing said electromagnetic device to position and maintain the movable member in a corresponding one of said actuated and nonactuated positions during said at least one of said logic states;
   rectifier means coupled to said inductor coil for, in response to said alternate providing of short and open circuits between said series terminals during said at least one of said logic states, rectifying a signal produced by said coil and providing a boost voltage potential with respect to said reference potential at an output terminal, said boost voltage potential being substantially greater than said nominal voltage potential; and
   electronic vehicle control means coupled to said output terminal as a load for said boost voltage.

14. A vehicle electronic control system according to claim 13 wherein said electronic vehicle control means includes an FET with a gate electrode coupled to said output terminal and one of a drain or source electrode of said FET connected to said nominal voltage potential, and which includes a battery for providing said nominal voltage potential.

15. A vehicle electronic control system according to claim 13 which includes an electronic clutch control means coupled to said electromagnetic device, said electromagnetic device controlling operation of said clutch control means.

16. A vehicle electronic control system according to claim 15 wherein said reference potential corresponds to ground potential.

17. A vehicle electronic control system according to claim 16 wherein said electromagnetic device comprises a relay and wherein said movable member results in shorting together two contacts of said relay during the effective on logic state of said control signal to provide operative battery power to said clutch control means.

* * * * *